(12) United States Patent
Li et al.

(10) Patent No.: US 12,274,010 B2
(45) Date of Patent: Apr. 8, 2025

(54) FLEXIBLE SUPPORT PLATE AND FLEXIBLE DISPLAY DEVICE

(71) Applicants: Chongqing BOE Display Technology Co., Ltd., Chongqing (CN); BOE Technology Group Co., Ltd., Beijing (CN)

(72) Inventors: Shaoru Li, Beijing (CN); Rui Wang, Beijing (CN); Jian Guo, Beijing (CN); Jonguk Kwak, Beijing (CN)

(73) Assignees: CHONGQING BOE DISPLAY TECHNOLOGY CO., LTD., Chongoing (CN); BOE TECHNOLOGY GROUP CO., LTD., Beijing (CN)

( * ) Notice: Subject to any disclaimer, the term of this patent is extended or adjusted under 35 U.S.C. 154(b) by 291 days.

(21) Appl. No.: 17/916,136

(22) PCT Filed: Nov. 15, 2021

(86) PCT No.: PCT/CN2021/130533
§ 371 (c)(1),
(2) Date: Sep. 30, 2022

(87) PCT Pub. No.: WO2022/127463
PCT Pub. Date: Jun. 23, 2022

(65) Prior Publication Data
US 2023/0111654 A1   Apr. 13, 2023

(30) Foreign Application Priority Data
Dec. 15, 2020   (CN) .......................... 202011478466.4

(51) Int. Cl.
G09F 9/30 (2006.01)
H05K 5/02 (2006.01)

(52) U.S. Cl.
CPC ...................................... *H05K 5/02* (2013.01)

(58) Field of Classification Search
CPC ........... H05K 5/02; G09F 9/301; H10K 59/10
See application file for complete search history.

(56) References Cited

U.S. PATENT DOCUMENTS 9,983,424 B2   5/2018   Kim et al.
10,334,750 B2   6/2019   Koo et al.
(Continued)

FOREIGN PATENT DOCUMENTS

CN   106252378 A   12/2016
CN   109032251 A   12/2018
(Continued)

OTHER PUBLICATIONS

International Search Report issued Jan. 27, 2022 in corresponding International Patent Application No. PCT/CN2021/130533 (with English translation), 6 pages.
(Continued)

*Primary Examiner* — Anthony M Haughton
*Assistant Examiner* — Hung Q Dang
(74) *Attorney, Agent, or Firm* — XSENSUS LLP

(57) ABSTRACT

A flexible support plate and a flexible display device. The flexible support plate includes an opening area and at least one solid area arranged on at least one side of the opening area, wherein the opening area is provided with a plurality of through holes; the opening area includes a middle area and a transition area; the transition area is arranged between the middle area and the solid area; and the width of the transition area decreases as the distance to the middle area increases.

20 Claims, 15 Drawing Sheets

(56) References Cited

U.S. PATENT DOCUMENTS

| | | | |
|---|---|---|---|
| 11,908,349 B2* | 2/2024 | Zhao | G06F 1/1652 |
| 2016/0357052 A1 | 12/2016 | Kim et al. | |
| 2019/0132987 A1 | 5/2019 | Koo et al. | |
| 2021/0153363 A1* | 5/2021 | Cao | H05K 5/0017 |
| 2021/0165454 A1* | 6/2021 | Dong | G06F 1/1652 |

FOREIGN PATENT DOCUMENTS

| | | |
|---|---|---|
| CN | 109148534 A | 1/2019 |
| CN | 110518039 A | 11/2019 |
| CN | 110767096 A | 2/2020 |
| CN | 110853525 A | 2/2020 |
| CN | 110992828 A | 4/2020 |
| CN | 210627726 U | 5/2020 |
| CN | 111312080 A | 6/2020 |
| CN | 111316344 A | 6/2020 |
| CN | 111508357 A | 8/2020 |
| CN | 111653204 A | 9/2020 |
| CN | 211928943 U | 11/2020 |
| CN | 112489564 A | 3/2021 |
| CN | 214042887 U | 8/2021 |
| EP | 3704686 A1 | 9/2020 |
| KR | 20190003257 A | 1/2019 |
| WO | 2019088372 A1 | 5/2019 |
| WO | 2021196870 A1 | 10/2021 |
| WO | 2021217845 A1 | 11/2021 |

OTHER PUBLICATIONS

Written Opinion issued Jan. 27, 2022 in corresponding International Patent Application No. PCT/CN2021/130533 (with English translation), 4 pages.

* cited by examiner

FLEXIBLE SUPPORT PLATE AND FLEXIBLE DISPLAY DEVICE

CROSS REFERENCE

The present disclosure is a U.S. national phase application of International Application No. PCT/CN2021/130533, filed on Nov. 15, 2021, which claims priority of Chinese Patent Application No. 202011478466.4, filed on Dec. 15, 2020 and entitled "FLEXIBLE SUPPORT PLATE AND FLEXIBLE DISPLAY DEVICE", the entire disclosure of which is incorporated herein by reference in its entirety.

TECHNICAL FIELD

The present disclosure relates to the field of display technology, and in particular, to a flexible support plate and a flexible display device including the flexible support plate.

BACKGROUND

A flexible OLED (Organic Light-Emitting Diode) display device includes a flexible display panel. A glass cover plate is attached on the flexible display panel. The glass cover plate protects the flexible display panel and maintains the strength of the flexible display panel. Due to the high hardness, low toughness, and brittle after being stretched of the glass cover plate, a surface of the folded flexible display panel needs to be protected by using a cover film. In order to ensure the strength of the flexible display panel, a stainless steel support plate is generally attached to a rear side of the flexible display panel. After the flexible display panel is bent, a neutral layer is changed due to stress change of a film layer, and separation and cracks of the film layer easily occur at an edge of a bending arc.

It should be noted that the information disclosed in the section above is only for enhancement of understanding of the background of the present disclosure, and thus may include information that does not constitute prior art already known to those of ordinary skill in the art.

SUMMARY

The object of the present disclosure is to provide a flexible support plate and a flexible display device including the flexible support plate.

According to one aspect of the present disclosure, a flexible support plate is provided, which includes: an opening area and at least one solid area arranged on at least one side of the opening area; wherein the opening area includes a middle area and a transition area, both the middle area and the transition area are provided with a plurality of through holes, the transition area is arranged between the middle area and the solid area, and a width of the transition area decreases as a distance to the middle area increases.

In some exemplary embodiments of present disclosure, the transition area includes:
a plurality of first transition sub-areas, wherein each of the first transition sub-areas is arranged between the middle area and the solid area, and a width of each of the first transition sub-areas decreases as a distance to the middle area increases.

In some exemplary embodiments of present disclosure, a boundary connecting the first transition sub-areas and the solid area is provided in an arc or a polyline shape.

In some exemplary embodiments of present disclosure, the plurality of first transition sub-areas have same shapes and same areas, or the plurality of first transition sub-areas have same shapes and different areas, or the plurality of first transition sub-areas have different shapes and different areas.

In some exemplary embodiments of present disclosure, the transition area further includes:
a plurality of second transition sub-areas, wherein each of the second transition sub-areas is connected between the first transition sub-areas and the solid area, and a width of an end portion of each of the second transition sub-areas close to the solid area decreases as a distance to the middle area increases.

In some exemplary embodiments of present disclosure, a boundary connecting the second transition sub-areas and the solid area is provided in an arc or a polyline shape.

In some exemplary embodiments of present disclosure, the plurality of second transition sub-areas have same shapes and same areas, or the plurality of second transition sub-areas have same shapes and different areas, or the plurality of second transition sub-areas have different shapes and different areas.

In some exemplary embodiments of present disclosure, a density of the through holes decreases as a distance to the middle area increases.

In some exemplary embodiments of present disclosure, a density of through holes in the middle area is equal to or greater than a density of through holes in the plurality of first transition sub-areas, and a density of through holes in the second transition sub-areas is smaller than the density of through holes in the plurality of first transition sub-areas.

In some exemplary embodiments of present disclosure, a cross-sectional area of the through hole decreases as a distance to the middle area increases.

In some exemplary embodiments of present disclosure, cross-sectional areas of through holes in the middle area are equal to or greater than cross-sectional areas of through holes in the plurality of first transition sub-areas, and cross-sectional areas of through holes in the second transition sub-areas are smaller than cross-sectional areas of through holes in the plurality of first transition sub-areas.

According to one aspect of the present disclosure, a flexible display device is provided, which includes the flexible support plate according to any of above aspects.

In some exemplary embodiments of present disclosure, the flexible display device further includes:
a flexible display panel arranged on a side of the flexible support plate, wherein the flexible display panel includes a bending area, a planar area, and a connecting area connected between the bending area and the planar area, the bending area is arranged opposite to the middle area of the flexible support plate, and the connecting area is arranged opposite to the transition area of the flexible support plate.

It should be understood that both the foregoing general description and the following detailed description are exemplary and explanatory only and do not limit the present disclosure.

BRIEF DESCRIPTION OF THE DRAWINGS

The drawings, which are incorporated in and constitute a part of this specification, illustrate embodiments consistent with the present disclosure and serve together with the specification to explain principles of the present disclosure. It is apparent that the drawings in the following description are only some embodiments of the present disclosure.

Figure 1:
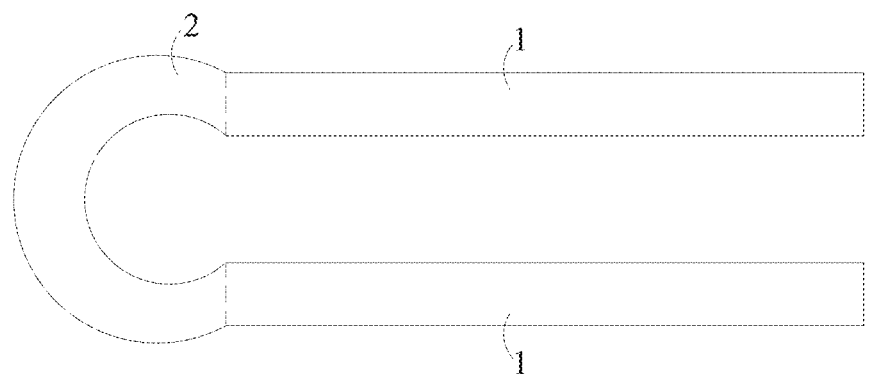
FIG. 1 is a schematic structural diagram of a flexible support plate in the related art.

REFERENCE NUMERALS 1. solid area;
2. opening area; 21. middle area; 22. transition area; 221. a first transition sub-area; 222. a second transition sub-area:
3. through hole.

DETAILED DESCRIPTION

Exemplary embodiments will now be described more comprehensively with reference to the drawings. However, the exemplary embodiments can be implemented in various forms, and should not be construed as being limited to the examples set forth herein. On the contrary, these embodiments are provided to make the present disclosure be more comprehensive and complete, and the concepts of the exemplary embodiments will be comprehensively communicated to those skilled in the art. The same reference numerals in the accompanying drawings denote the same or similar structures, and thus detailed description thereof will be omitted.

Figure 2:
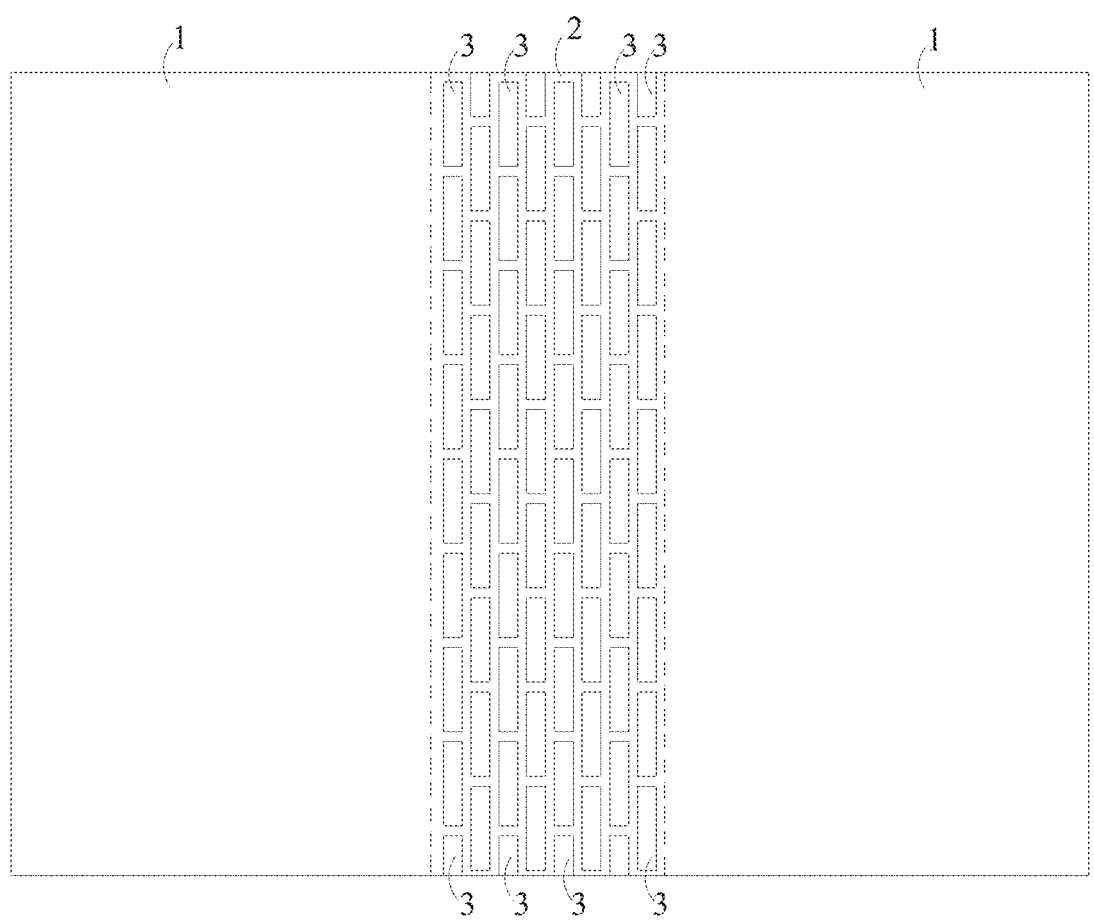
FIG. 2 is a schematic structural diagram of the flexible support plate of FIG. 1 after being unfolded.

Referring to FIGS. 1 and 2, which shows a schematic structural diagram of a flexible support plate in the related art, in order to achieve a smaller bending radius and reduce the stress in the film layer after bending, a patterned flexible support plate will be used. That is, some patterns are designed and a through hole 3 is formed in a middle position of the bending flexible support plate, so as to increase the ductility and plasticity of the flexible support plate and reduce the changes of stress. However, since the stress in the opening area 2 of the flexible support plate is different from the stress in the solid area 1 of the flexible support plate, a hard-angle bending occurs due to sudden changes of the stress at a connection position where the opening area 2 is connected with the solid area 1 during bending. That is, the opening area 2 is easy to be bent and the solid area 1 is not easy to be bent. As a result, a bending angle rather than a bending arc is formed at the connection position, resulting in the occurrence of separation and cracks in the film layer at the transition position between the opening area 2 and the solid area 1, which is not suitable for flexible display device having a small bending radius to employ.

Exemplary embodiments of the present disclosure first provide a flexible support plate. Referring to FIGS. 3 to 17, which show schematic structural diagrams of examples of a flexible support plate according embodiments of the present disclosure, the flexible support plate may include an opening area 2 and at least one solid area 1 arranged on at least one side of the opening area 2. The opening area 2 includes a middle area 21 and a transition area 22. Both the middle area 21 and the transition area 22 are provided with a plurality of through holes 3. The transition area 22 is arranged between the middle area 21 and the solid area 1, and a width of the transition area 22 decreases as a distance to the middle area 21 increases.

Figure 16:
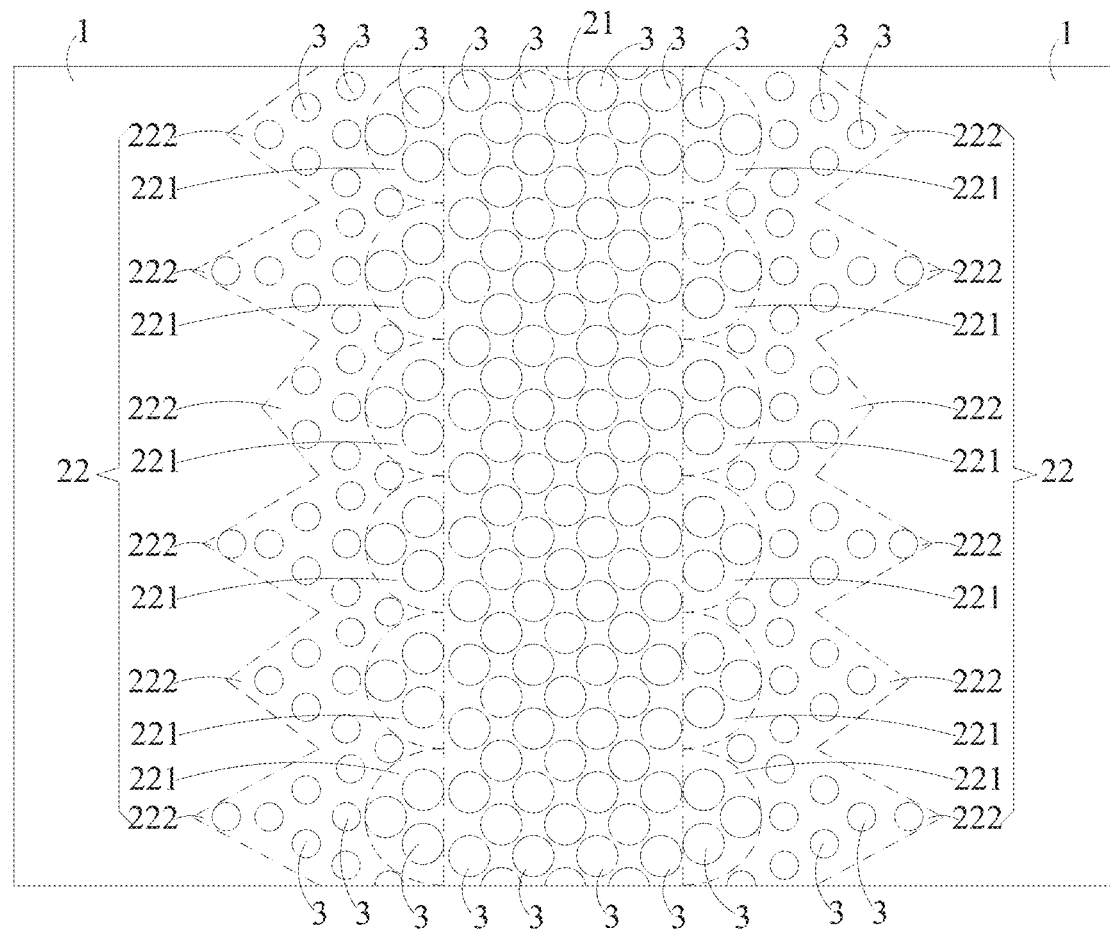
FIG. 16 is a schematic structural diagram of a fourteenth example of a flexible support plate according to an embodiment of the present disclosure.
Figure 17:
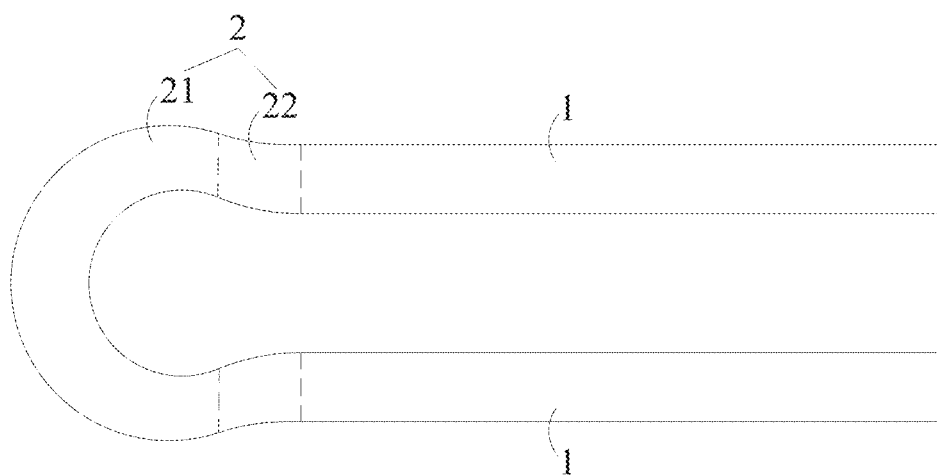
FIG. 17 is a schematic structural diagram of a flexible support plate after being bent according to an embodiment of the present disclosure.

In the flexible support plate according to embodiments of the present disclosure, the width of the transition area 22 decreases as the distance to the middle area 21 increases, such that the transition area 22 forms a diminishing structure. Referring to FIG. 16, when the flexible support plate is bent, the deformation of the transition area 22 gradually changes, and stress also gradually changes without a sudden change. That is, the stress changes relatively uniformly, thereby avoiding hard-angle bending caused by the sudden change of the stress during bending, so that the separation and cracks of the film layer can be avoided. Above structure can also be applied to a flexible display device with a small bending radius.

The structure of the flexible support plate will be described in detail below.

Referring to FIGS. 3 to 12, in some exemplary embodiments, the flexible support plate may be provided in a rectangular shape. The flexible support plate may include an opening area 2 located at a middle position in a length direction, and two solid areas 1 connected to both sides of the opening area 2. The opening area 2 is provided with a plurality of through hole 3, and no through hole 3 is provided in the solid area 1. In some other exemplary embodiments of the present disclosure, the flexible support plate may be provided in various shapes such as a square, a polygon, and the like. It is also possible to provide only one solid area 1 on one side of the opening area 2, or it is possible to provide a plurality of solid areas 1 on multiple sides of the opening area 2.

The opening area 2 may include a middle area 21 and a transition area 22. The middle area 21 is provided in a rectangular shape. A length of the middle area 21 is the same as a width of the flexible support plate, that is, the middle area 21 runs through both ends of the flexible support plate in a width direction. One side of the flexible support plate is provided with a flexible display panel. A bending area of the flexible display panel is arranged opposite to the middle area 21 of the flexible support plate. A connecting area of the flexible display panel is arranged opposite to the transition area 22 of the flexible support plate. In addition, a shape of the middle area 21 can also be provided in other shapes as required, which is not repeated herein.

Referring to FIGS. 3 to 9, the transition area 22 may include a plurality of first transition sub-areas 221, and each of the first transition sub-areas 221 is connected between the middle area 21 and the solid area 1. That is, the plurality of first transition sub-areas 221 are arranged along the width direction of the flexible support plate, and a width of the first transition sub-area 221 decreases as a distance to the middle area 21 increases.

In all exemplary embodiments, the width of the first transition sub-area 221 refers to a dimension of the first transition sub-area 221 in the width direction of the flexible support plate. In other words, the width of the first transition sub-area 221 is perpendicular to a connection direction of the middle area 21, the transition area 22 and the solid area 1.

Figure 3:
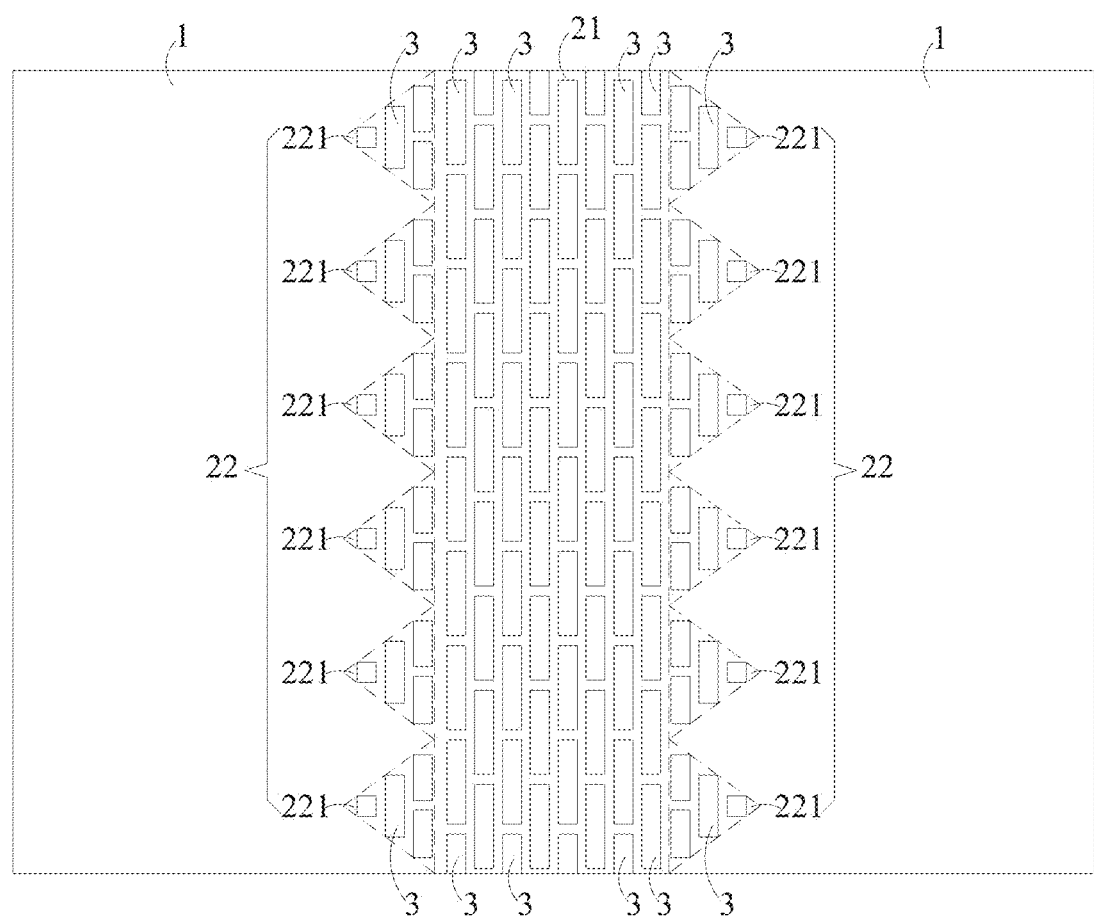
FIG. 3 is a schematic structural diagram of a first example of a flexible support plate according to an embodiment of the present disclosure.
Figure 4:
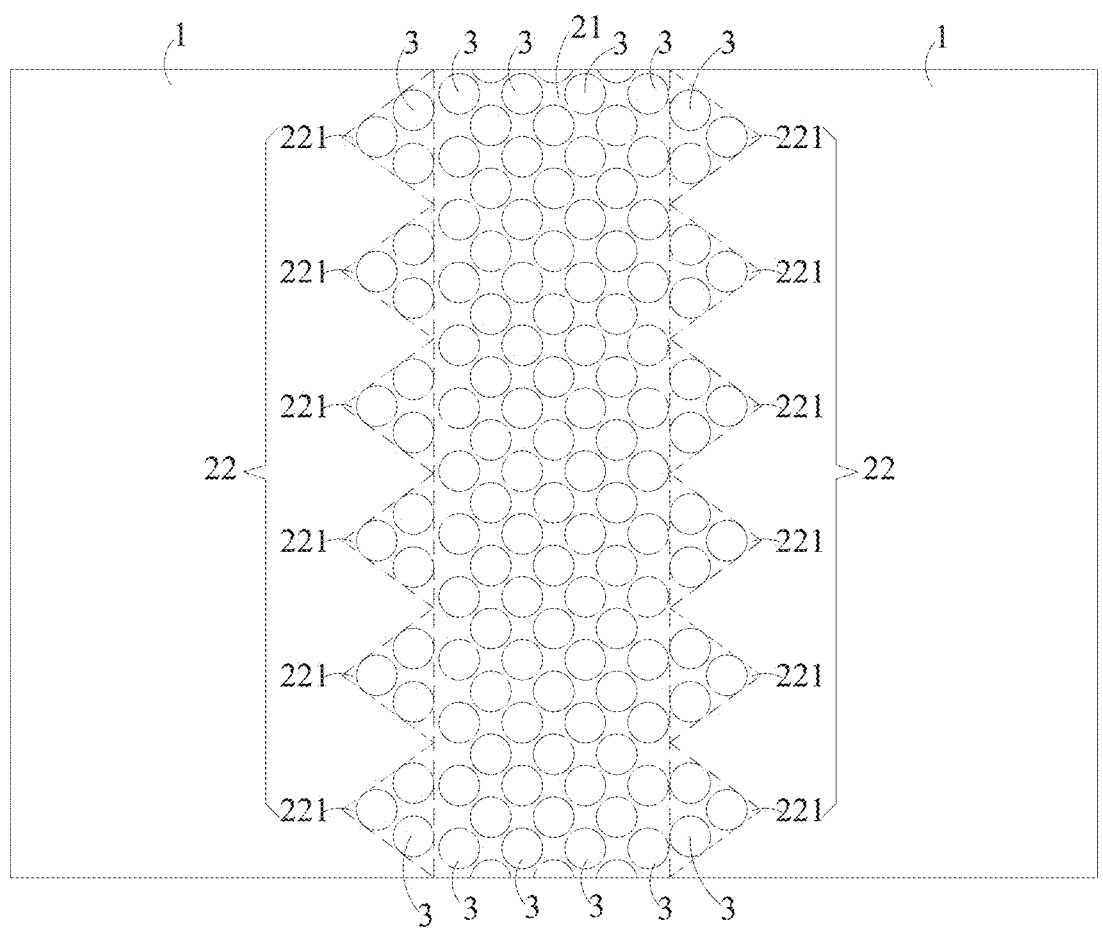
FIG. 4 is a schematic structural diagram of a second example of a flexible support plate according to an embodiment of the present disclosure.

Referring to FIGS. 3 and 4, the first transition sub-area 221 may be provided in an isosceles triangle shape, and a base of the isosceles triangle is collinear with a borderline of the middle area 21, such that the width of the first transition sub-area 221 decreases as the distance to the middle area 21 increases, and a boundary connecting the first transition sub-area 221 and the solid area 1 is formed as a polyline. In some other exemplary embodiments of the present disclosure, the first transition sub-area 221 may also be provided in an isosceles trapezoid shape, and a long base of the isosceles trapezoid is collinear with the borderline of the middle area 21, such that the width of the first transition sub-area 221 decreases as the distance to the middle area 21 increases, and the boundary connecting the first transition sub-area 221 and the solid area 1 is formed as a polyline. In some embodiments, the first transition sub-area 221 may be provided in any triangle or any trapezoid shape, or may be provided in a pentagon or a polygon shape, as long as one long side of the pentagon or the polygon is collinear with the borderline of the middle area 21. The portion of the pentagon or the polygon close to the solid area 1 has a diminishing structure, such that the width of the first transition sub-area 221 decreases as the distance to the middle area 21 increases.

It should be noted that the boundary connecting the first transition sub-area 221 and the solid area 1 is a hypothetical line segment or are line formed by connecting points closest to the solid area 1 on at least one through hole in the first transition sub-area 221, or a hypothetical line segment or arc line formed by connecting points, which are spaced at a set distance from points closest to the solid area 1 on at least one through hole in the first transition sub-area 221.

Figure 5:
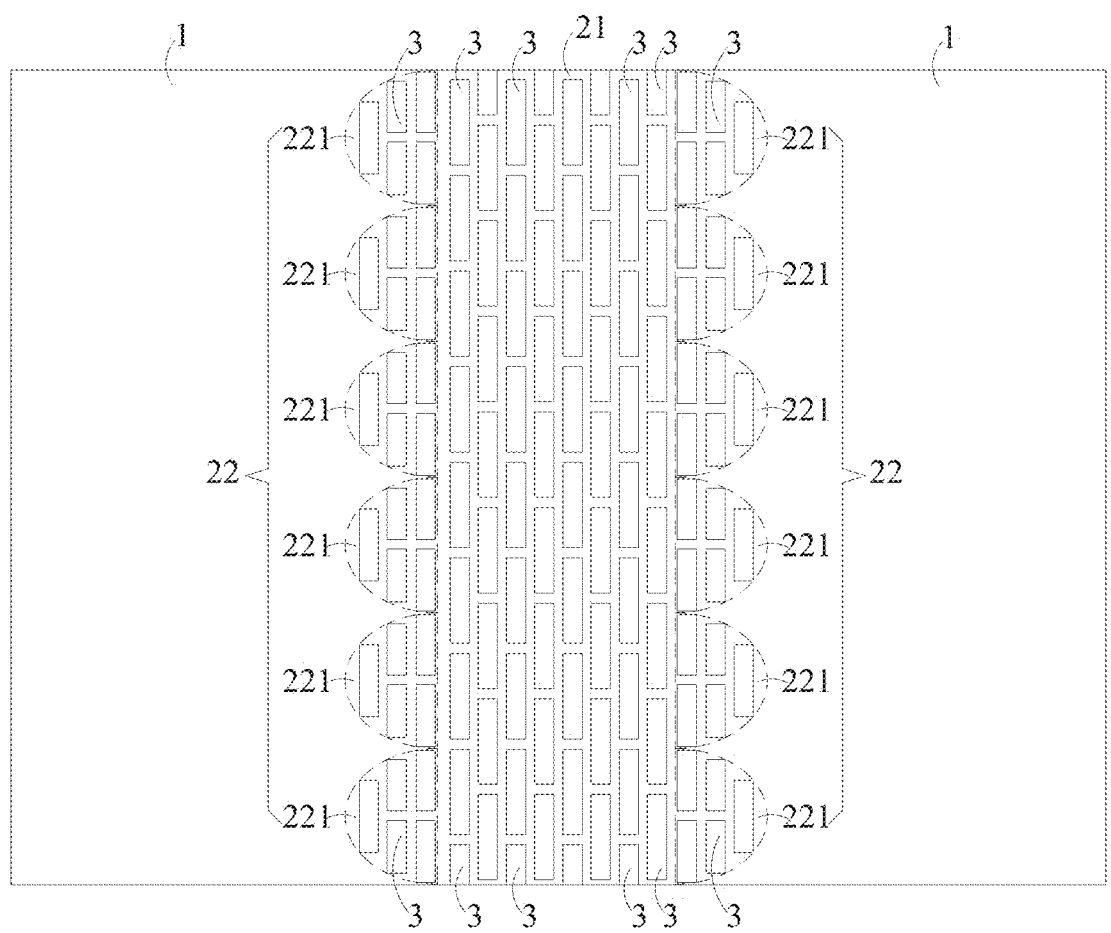
FIG. 5 is a schematic structural diagram of a third example of a flexible support plate according to an embodiment of the present disclosure.
Figure 6:
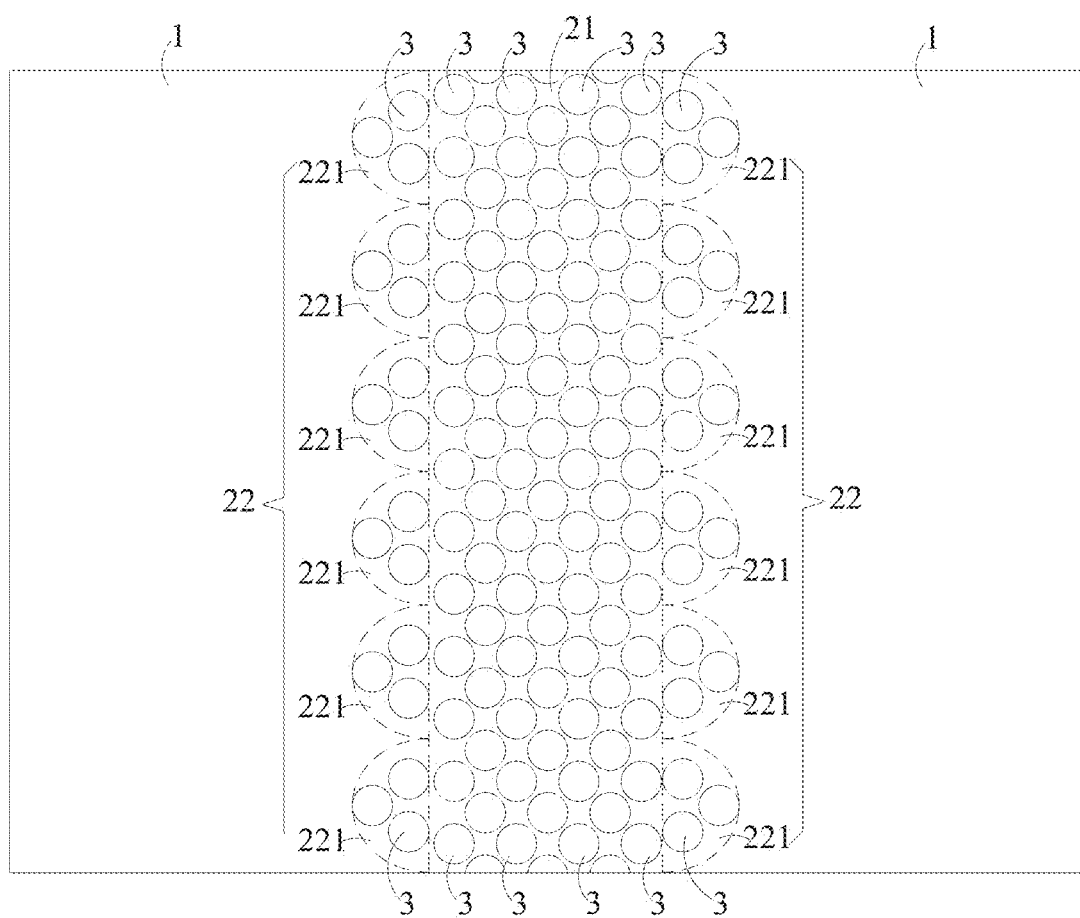
FIG. 6 is a schematic structural diagram of a fourth example of a flexible support plate according to an embodiment of the present disclosure.

Referring to FIGS. 5 and 6, the first transition sub-area 221 may be provided in a semiellipse shape, and a straight side of the semiellipse is collinear with the borderline of the middle area 21, such that the width of the first transition sub-area 221 decreases as the distance to the middle area 21 increases, and the boundary connecting the first transition sub-area 221 and the solid area 1 is formed as an arc line. In other exemplary embodiments of the present disclosure, the first transition sub-area 221 may be provided in an insufficient-semiellipse shape, such that the width of the first transition sub-area 221 decreases as the distance to the middle area 21 increases, and the boundary connecting the first transition sub-area 221 and the solid area 1 is formed as an arc line. Further, the first transition sub-area 221 may also be provided in a semicircle or an insufficient-semicircle shape, or the boundary connecting the first transition sub-area 221 and the solid area 1 may be provided in a parabolic arc shape. The boundary connecting the first transition sub-area 221 and the solid area 1 may also be provided in any arc or various combined arcs shapes, as long as the width of the first transition sub-area 221 decreases as the distance to the middle area 21 increases.

Referring to FIGS. 3 and 5, the through hole 3 may be a rectangular through hole, and the width of the rectangular through hole 3 in the opening area 2 is the same, but the length of the rectangular through hole 3 may be different according to an arranged position thereof. For example, the rectangular through hole in the middle area has a longer length and the rectangular through hole in the first transition sub-area 221 has a shorter length.

Referring to FIGS. 4 and 6, the through hole 3 may be a circular through hole, and a diameter of the circular through hole 3 in the opening area 2 may be the same.

A shape of the through hole 3 is not limited to the above description. For example, in other exemplary embodiments of the present disclosure, the through hole 3 may also be a kidney-ellipsoid through hole, an ellipse through hole, a square through hole, and other various shapes, all of which fall within the scope of the present disclosure.

Figure 7:
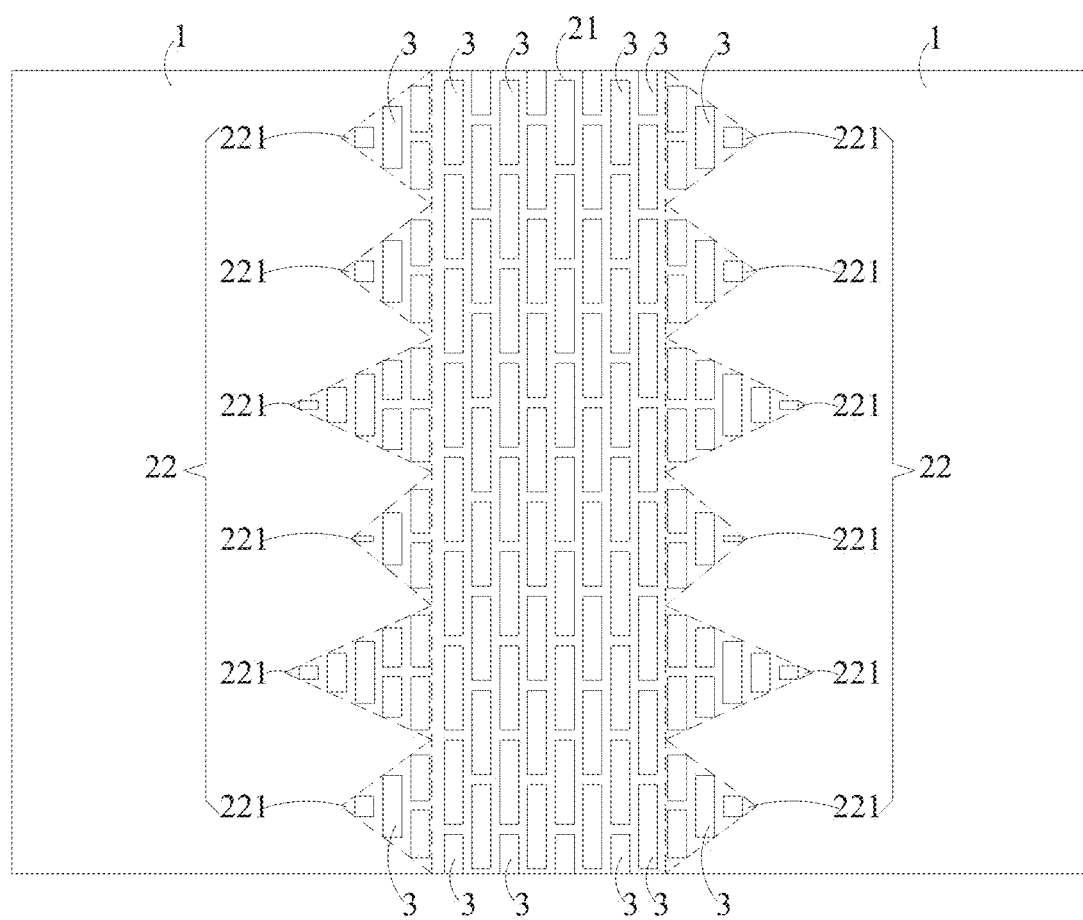
FIG. 7 is a schematic structural diagram of a fifth example of a flexible support plate according to an embodiment of the present disclosure.
Figure 8:
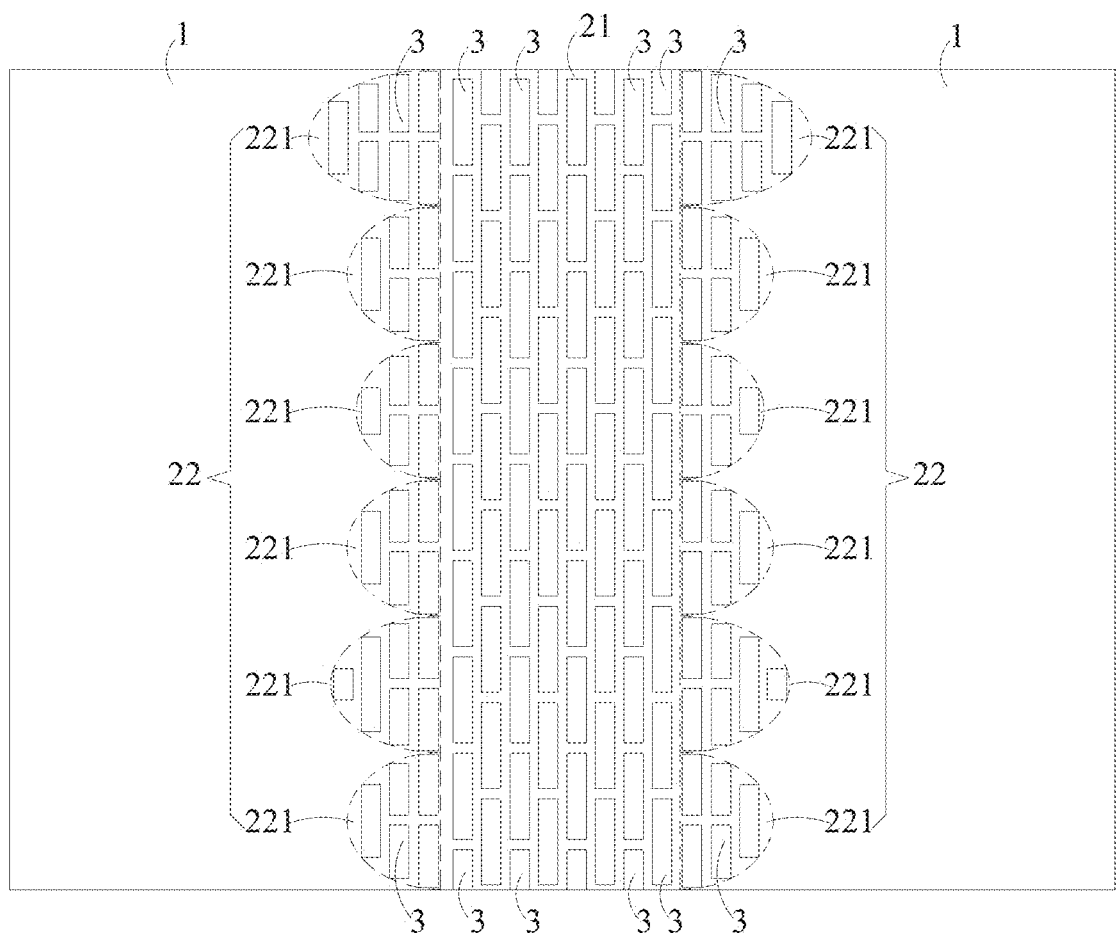
FIG. 8 is a schematic structural diagram of a sixth example of a flexible support plate according to an embodiment of the present disclosure.

In above exemplary embodiments, the plurality of first transition sub-areas 221 have the same shapes and the same areas. In other exemplary embodiments, the plurality of first transition sub-areas 221 have the same shapes but different areas. Referring to FIG. 7, the plurality of first transition sub-areas 221 are all isosceles triangles, and base lengths of the isosceles triangles are the same, but heights are different, leading to different areas of the isosceles triangles. Referring to FIG. 8, the plurality of first transition sub-areas 221 have the same shape, that is, they are all semiellipses, but the semiellipses have different axial lengths, leading to different areas of the semiellipses.

Figure 9:
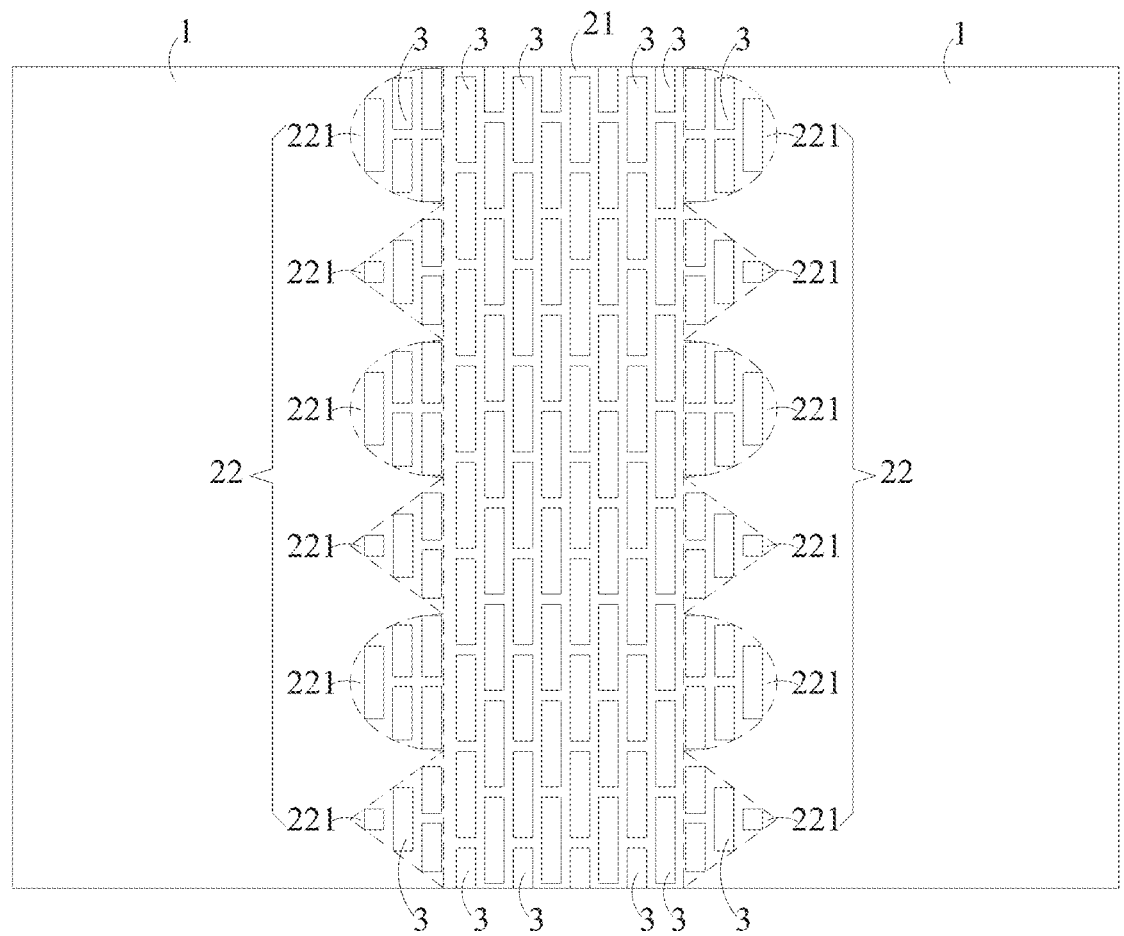
FIG. 9 is a schematic structural diagram of a seventh example of a flexible support plate according to an embodiment of the present disclosure.

In some embodiments, the plurality of first transition sub-areas 22 may have different shapes and different areas. Referring to FIG. 9, the plurality of first transition sub-areas 221 may have a structure in which isosceles triangles and semiellipses are arranged at intervals, that is, one isosceles triangle and one semiellipse are arranged in sequence, and one semiellipse is arranged between two adjacent isosceles triangles. In some other embodiments, the isosceles triangle and the semiellipse can also be arranged in various ways. For example, every two isosceles triangles and every two semiellipses can be arranged at intervals, that is, two isosceles triangles and two semiellipses are arranged in sequence, and the two semiellipses are arranged between two adjacent isosceles triangles. For another example, the isosceles triangle and the semiellipse can also be arranged irregularly, which will be not repeated herein.

In addition, the plurality of first transition sub-areas 221 may have different shapes but the same areas. The plurality of first transition sub-areas 221 can be arranged in the same way as that shown in FIG. 9, but the area of the isosceles triangle can be the same as the area of the semicircle through calculation, so as to achieve the purpose of avoiding the separation and cracks of the film layer.

Figure 10:
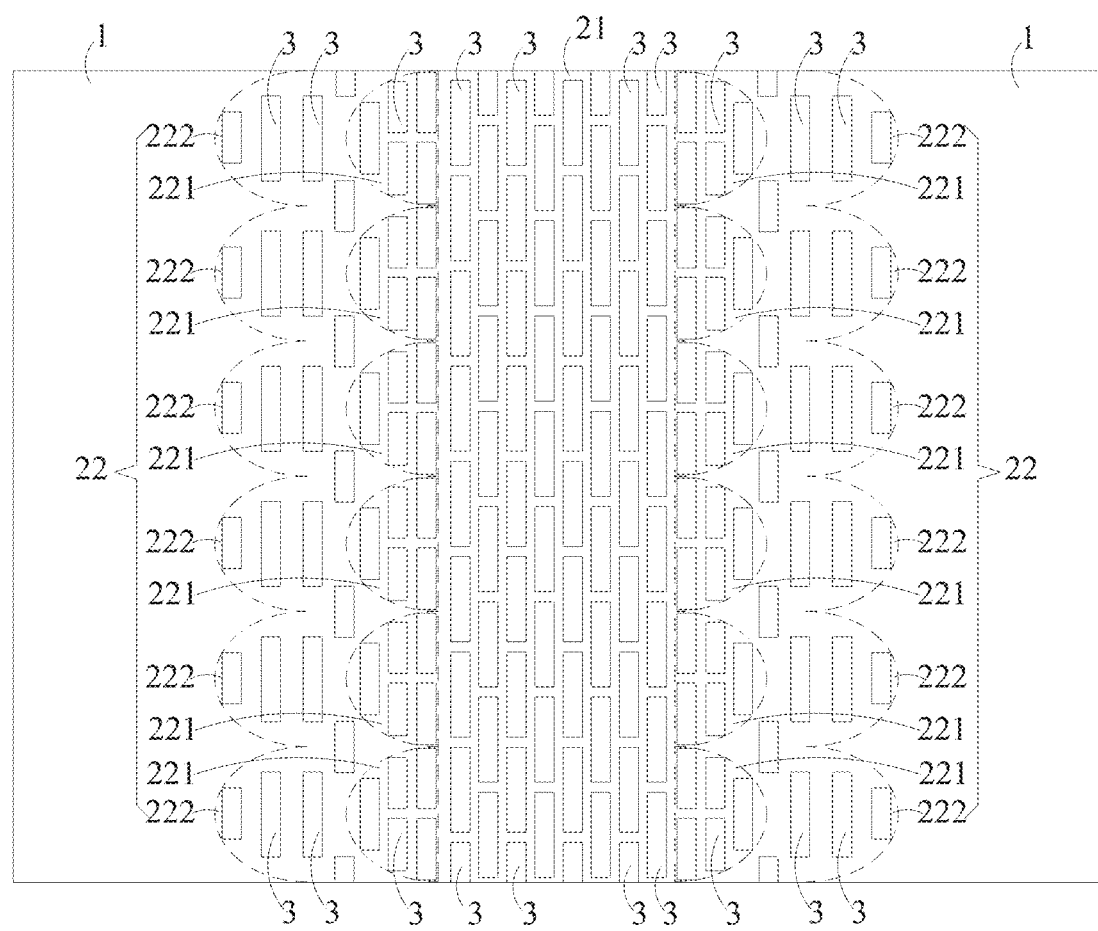
FIG. 10 is a schematic structural diagram of an eighth example of a flexible support plate according to an embodiment of the present disclosure.
Figure 11:
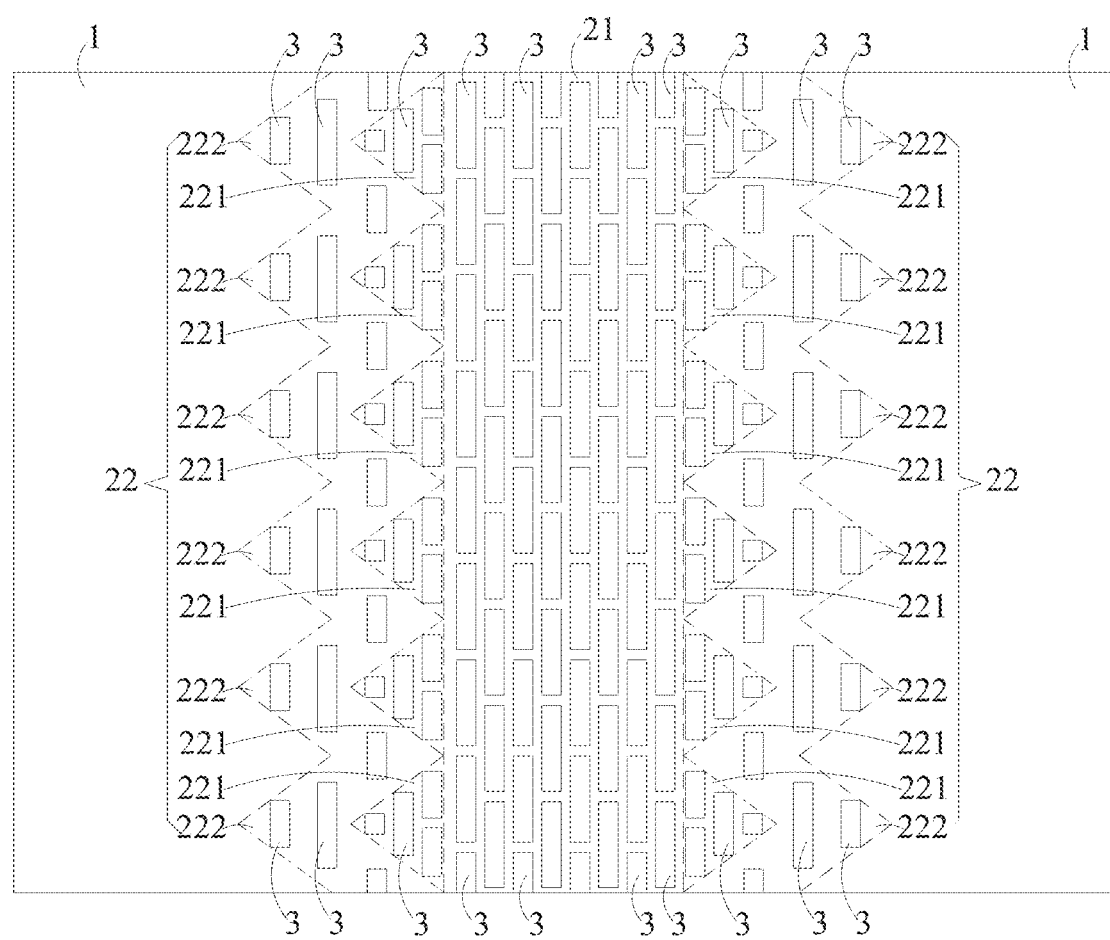
FIG. 11 is a schematic structural diagram of a ninth example of a flexible support plate according to an embodiment of the present disclosure.
Figure 12:
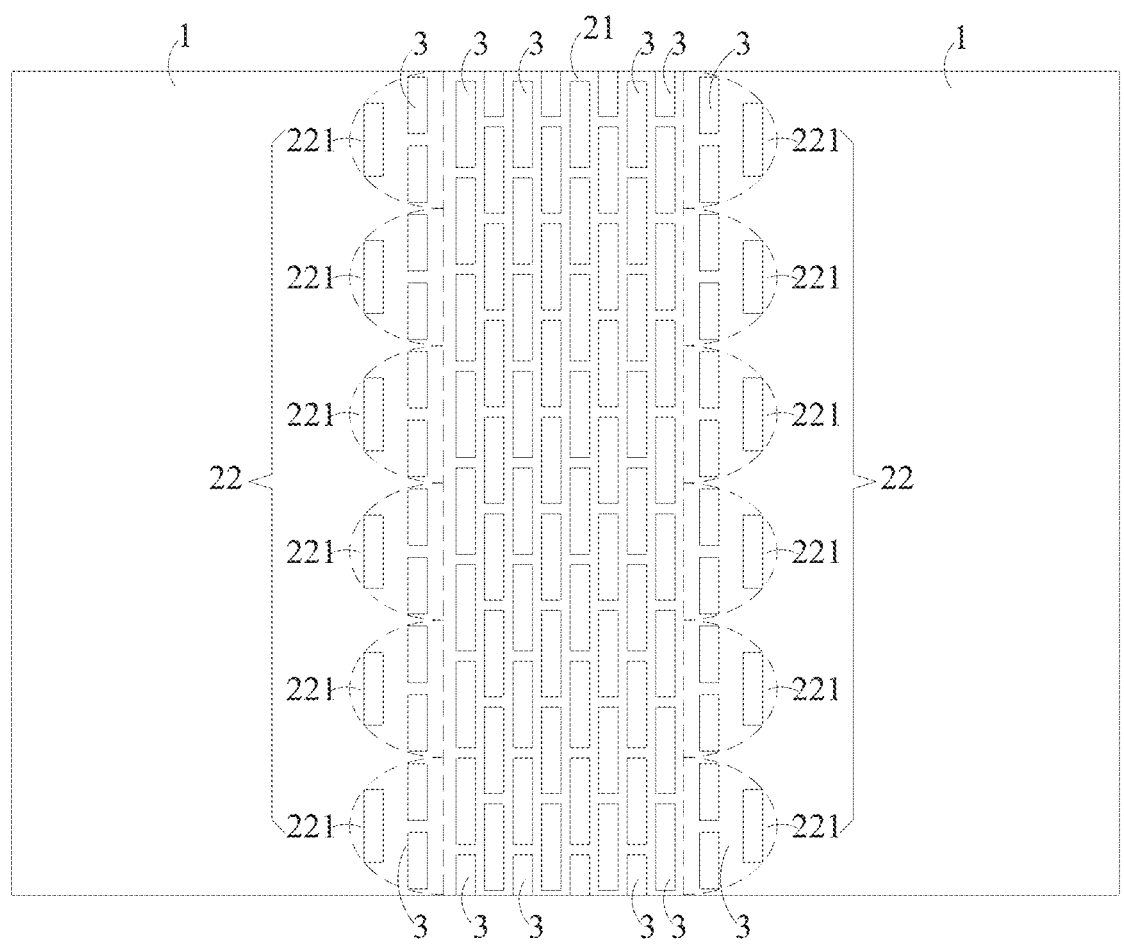
FIG. 12 is a schematic structural diagram of a tenth example of a flexible support plate according to an embodiment of the present disclosure.
Figure 13:
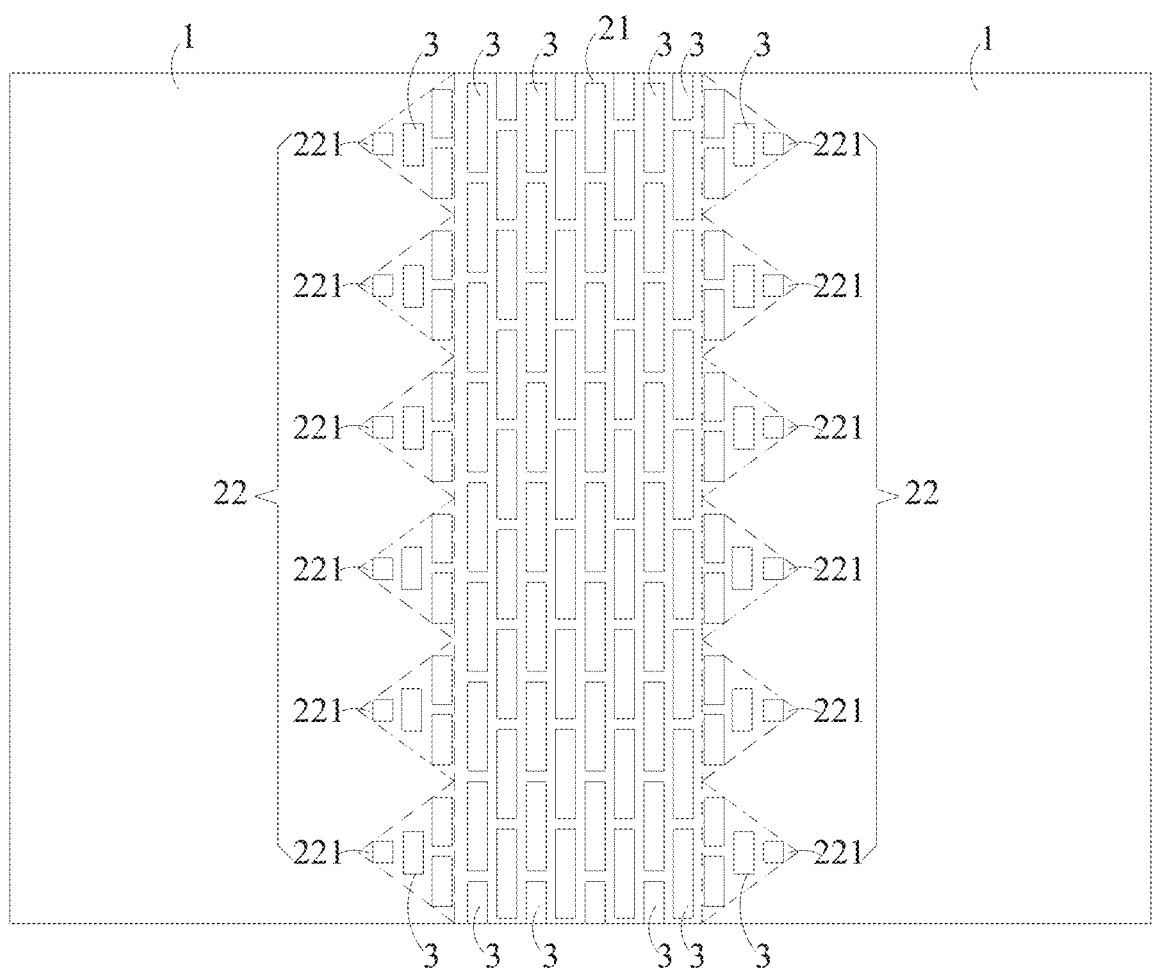
FIG. 13 is a schematic structural diagram of an eleventh example of a flexible support plate according to an embodiment of the present disclosure.
Figure 14:
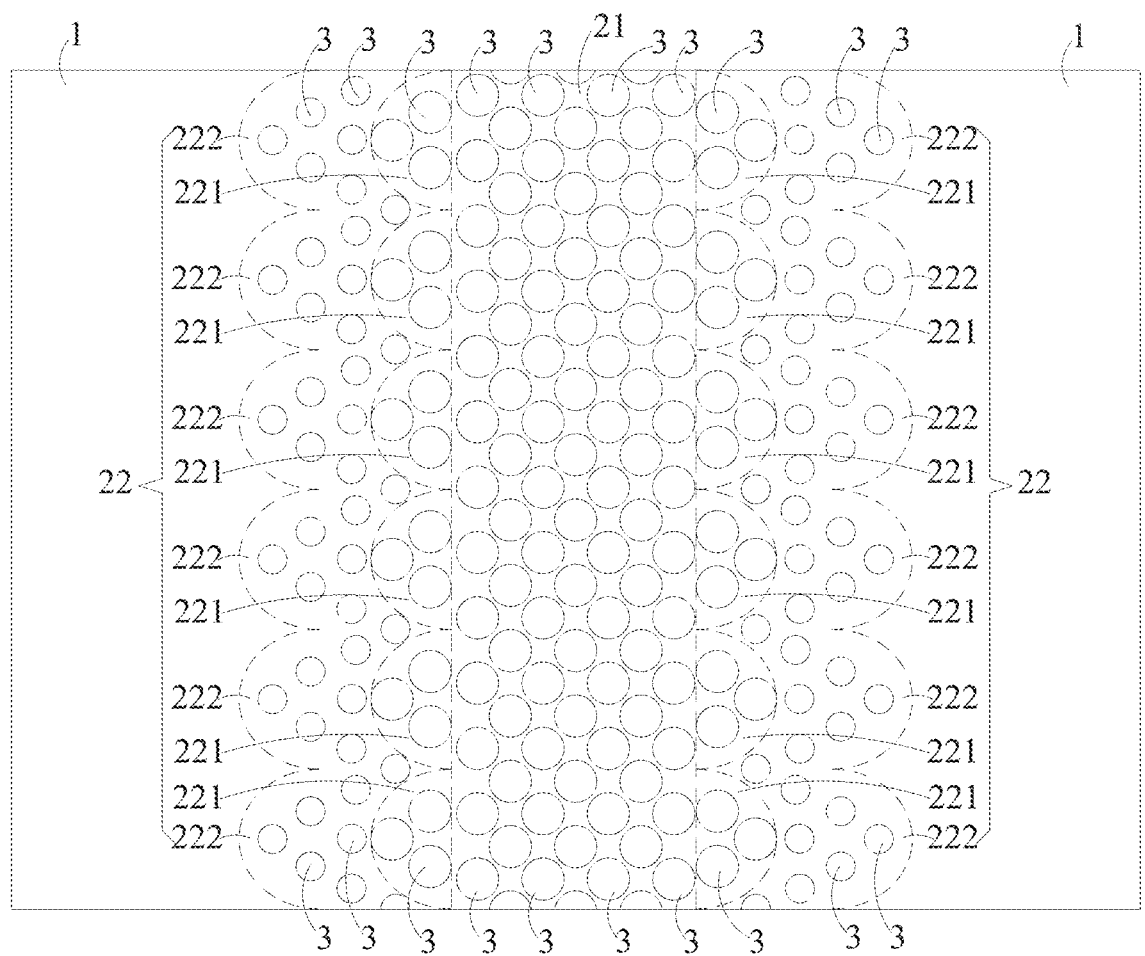
FIG. 14 is a schematic structural diagram of a twelfth example of a flexible support plate according to an embodiment of the present disclosure.

In some other exemplary embodiments of the present disclosure, referring to FIGS. 10 to 12, the transition area 22 may further include a plurality of second transition sub-areas 222, and each of the second transition sub-areas 222 is connected between the first transition sub-area 221 and the solid area 1. That is, the plurality of second transition sub-areas 222 are arranged in the width direction of the flexible support plate, and a width of an end portion of the second transition sub-area 222 close to the solid area 1 decreases as a distance to the middle area 21 increases.

In all exemplary embodiments, the width of the first transition sub-area 221 refers to a dimension of the first transition sub-area 221 in the width direction of the flexible support plate. In other words, the width of the first transition sub-area 221 is perpendicular to a connection direction of the middle area 21, the transition area 22 and the solid area 1.

Referring to FIG. 10, a boundary connecting the second transition sub-area 222 and the solid area 1 can be provided in a semi-elliptical arc shape, such that the width of the end portion of the second transition sub-area 222 close to the solid area 1 decreases as the distance to the middle area 21 increases. In other exemplary embodiments of the present disclosure, the boundary connecting the second transition sub-area 222 and the solid area 1 can also be provided in multiple kinds of arcs such as an insufficient-semi-elliptical arc, a semi-circular arc, an insufficient-semi-circular arc, a parabolic arc, and the boundary connecting the second transition sub-area 222 and the solid area 1 can also be provided in any arc or various combined arcs shapes, as long as the width of the end portion of the second transition sub-area 222 close to the solid area 1 decreases as the distance to the middle area 21 increases.

It should be noted that the boundary connecting the second transition sub-area 222 and the solid area 1 is a hypothetical line segment or arc line formed by connecting points closest to the solid area 1 on at least one through hole in the second transition sub-area 222, or a hypothetical line segment or arc line formed by connecting points, which are spaced at a set distance from points closest to the solid area 1 on at least one through hole in the second transition sub-area 222.

A boundary connecting the first transition sub-area 221 and the second transition sub-area 222 is a hypothetical line segment or arc line formed by connecting points closest to the second transition sub-area 222 on at least one through hole in the first transition sub-area 221, or a hypothetical line segment or arc line formed by connecting points, which are spaced at a set distance from points closest to the second transition sub-area 222 on at least one through hole in the first transition sub-area 221.

Referring to FIG. 11, the boundary connecting the second transition sub-area 222 and the solid area 1 may also be provided in a polyline shape, such that the end portion of the second transition sub-area 222 close to the solid area 1 forms a triangle, and such that the width of the end portion of the second transition sub-area 222 close to the solid area 1 decreases as the distance to the middle area 21 increases In other exemplary embodiments of the present disclosure, the end portion of the second transition sub-area 222 close to the solid area 1 may also form a trapezoid, a pentagon, a polygon, or the like, as long as a portion of the trapezoid, the pentagon, or the polygon close to the solid area 1 forms a diminishing structure, such that the width of the end portion of the second transition sub-area 222 close to the solid area 1 decreases as the distance to the middle area 21 increases.

Continuing to refer to FIGS. 10 and 11, a shape of the boundary connecting the second transition sub-area 222 and the solid area 1 may be the same as a shape of a boundary connecting the second transition sub-area 222 and the first transition sub-area 221. For example, the boundary connecting the second transition sub-area 222 and the solid area 1 may be a semi-elliptical arc, and the boundary connecting the second transition sub-area 222 and the first transition sub-area 221 may also be a semi-elliptical arc. In some embodiments, the boundary connecting the second transition sub-area 222 and the solid area 1 may be a polyline, and the boundary connecting the second transition sub-area 222 and the first transition sub-area 221 may also be a polyline. In a case where the boundary connecting the second transition sub-area 222 and the first transition sub-area 221 is provided in a semicircular arc, an insufficient-semi-elliptical arc, a parabolic arc, or other shapes, the boundary connecting the second transition sub-area 222 and the solid area 1 may correspondingly be provided in a semicircular arc, an insufficient-semi-elliptical arc, a parabolic arc, or other shapes.

A density of the through holes 3 may decrease as a distance to the middle area 21 increases. A density of the through holes 3 may be the same for all through holes in the first transition sub-area 221, or a density of the through holes 3 may be the same for all through holes in the second transition sub-area 222, but a density of the through holes in the first transition sub-area 221, a density of the through holes in the second transition sub-area 222, and a density of the through holes in the middle area 21 are different. In exemplary embodiments shown in FIGS. 10 and 11, a density of the through holes 3 in the middle area 21 is the same as a density of the through holes 3 in the plurality of first transition sub-areas 221, and a density of the through holes 3 in the second transition sub-area 222 is smaller than a density of the through holes 3 in the first transition sub-area 221. In some embodiments, a density of the through holes 3 in the middle area 21 is greater than a density of the through holes 3 in the first transition sub-area 221, and a density of the through holes 3 in the second transition sub-area 222 is smaller than a density of the through holes 3 in the first transition sub-area 221. In a case where a third transition sub-area 22 is provided, a density of the through holes 3 in the third transition sub-area 22 may be smaller than a density of the through holes 3 in the second transition sub-area 222. A density of the through holes 3 may also change gradually in the first transition sub-area 221 or in the second transition sub-area 222. For example, referring to FIG. 13, a density of the through holes 3 in the first transition sub-area 221 decreases as the distance to the middle area 21 increases.

Figure 15:
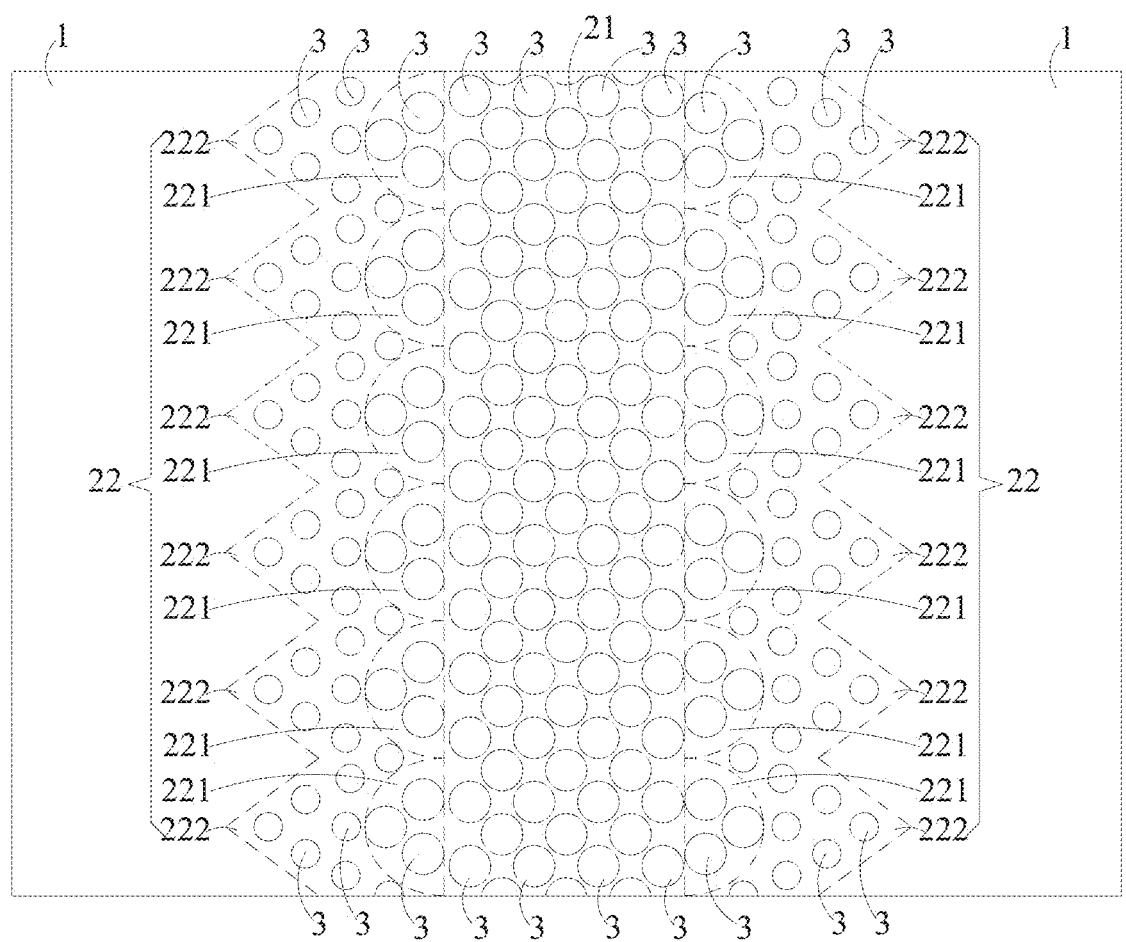
FIG. 15 is a schematic structural diagram of a thirteenth example of a flexible support plate according to an embodiment of the present disclosure.

A cross-sectional area of the through hole 3 may decrease as the distance to the middle area 21 increases. The cross-sectional area of the through hole 3 may change gradually in the first transition sub-area 221 or in the second transition sub-area 222. For example, referring to FIG. 14, the through hole 3 is an elongated through hole, the cross-sectional area of the through hole 3 in the first transition sub-area 221 decreases as the distance to the middle area 21 increases. That a length of the through hole 3 decreases is shown in the figure, and alternatively, a width of the through hole 3 may also decrease. A cross-sectional area of the through hole 3 may be the same for all through holes in the first transition sub-area 221, or a cross-sectional area of the through hole 3 may be the same for all through holes in the second transition sub-area 222, but a cross-sectional area of the through hole in the first transition sub-area 221, a cross-sectional area of the through hole in the second transition sub-area 222, and a cross-sectional area of the through hole in the middle area 21 are different. Referring to FIG. 15, the through hole 3 is a circular through hole, a diameter of the through hole 3 in the middle area 21 is the same as a diameter of the through hole 3 in the plurality of first transition sub-areas 221, and a diameter of the through hole 3 in the second transition sub-area 222 is smaller than a diameter of the through hole 3 in the first transition sub-area 221. In some embodiments, a diameter of the through hole 3 in the middle area 21 is greater than a diameter of the through hole 3 in the plurality of first transition sub-areas 221, and a diameter of the through hole 3 in the second transition sub-area 222 is smaller than a diameter of the through hole 3 in the first transition sub-area 221. In a case where a third transition sub-area is provided, a diameter of the through hole 3 in the third transition sub-area may be smaller than a diameter of the through hole 3 in the second transition sub-area 222

In some embodiments, a shape of the boundary connecting the second transition sub-area 222 and the solid area 1 may be different from a shape of the boundary connecting the second transition sub-area 222 and the first transition sub-area 221. For example, referring to FIG. 15, the boundary connecting the second transition sub-area 222 and the solid area 1 may be a polyline, and the boundary connecting the second transition sub-area 222 and the first transition sub-area 221 is a semicircular arc. Alternatively, the boundary connecting the second transition sub-area 222 and the solid area 1 may be a semi-elliptical arc, and the boundary connecting the second transition sub-area 222 and the first transition sub-area 221 is a polyline.

According to above exemplary embodiments, in the case where the plurality of first transition sub-areas 221 have the same shapes and the same areas, the plurality of second transition sub-areas 222 may have the same shapes and the same areas. As shown in FIG. 16, in the case where the plurality of first transition sub-areas 221 have the same shapes and the same areas, the plurality of second transition sub-areas 222 may have the same shapes but different areas. In some embodiments, the plurality of second transition sub-areas 222 may have different shapes and areas. In a case where the plurality of first transition sub-areas 221 have different shapes and areas, the plurality of second transition sub-areas 222 may have different shapes but the same areas, alternatively, the plurality of second transition sub-areas 222 may also have different shapes and areas.

In still other exemplary embodiments of the present disclosure, the transition area 22 may further include a plurality of third transition sub-areas, and each of the third transition sub-areas is connected between the second transition sub-area 222 and the solid area 1. A width of an end portion of the third transition sub-area close to the solid area 1 decreases as a distance to the middle area 21 increases. A boundary connecting the third transition sub-area and the solid area 1 may be provided in an arc or a polyline shape. A specific structure of the arc or the polyline is as described above, which will not be repeated herein.

Further, some exemplary embodiments of the present disclosure provide a flexible display device, which may include the flexible support plate described in any of above embodiments. The specific structure of the flexible support plate has been described above in detail, which will not be repeated herein.

In some exemplary embodiments, the flexible display device may further include a flexible display panel. The flexible display panel is arranged on a side of the flexible support plate. The flexible display panel includes a bending area, a planar area, and a connecting area connected between the bending area and the planar area. The bending area of the flexible display panel is arranged opposite to the middle area 21 of the flexible support plate. That "arranged opposite to" may mean that the bending area is right opposite to the middle area 21. That is, an orthographic projection of the bending area on the flexible support plate coincides with the middle area 21, or the orthographic projection of the bending area on the flexible support plate is slightly larger or smaller than the middle area 21. The connecting area of the flexible display panel is arranged opposite to the transition area 22 of the flexible support plate. That "arranged opposite to" may mean that the connecting area is right opposite to the transition area 22. That is, an orthographic projection of the connecting area on the flexible support plate coincides with the transition area 22, or the orthographic projection of the connecting area on the flexible support plate is slightly larger or smaller than the transition area 22.

When the flexible display device is bent, the deformation of the transition area 22 of the flexible support plate changes gradually, and stress also changes gradually without a sudden change. That is, the stress changes relatively uniformly, thereby avoiding hard-angle bending caused by the sudden change of the stress in the flexible support plate during bending, so that the separation and cracks of the film layer of the flexible display panel can be avoided. Above structure can also be applied to a flexible display device with a small bending radius.

The features, structures or characteristics described above may be combined in any suitable manner in one or more embodiments, and the features discussed in various embodiments are interchangeable if possible. In above description, numerous specific details are provided to give a thorough understanding of embodiments of the present disclosure. However, those skilled in the art will appreciate that the technical solution of the present disclosure may be practiced without one or more of the specific details, or other methods, components, materials and the like may be employed. In other cases, well-known structures, materials or operations are not shown or described in detail to avoid obscuring various aspects of the present disclosure.

Although relative terms such as "upper" and "lower" are used in the specification to describe a relationship of one component relative to another component, these terms are used in the specification for convenience only, for example, according to a direction of an example described in the figure. It can be understood that if the device illustrated is flipped upside down, the component described as "above" will become the component "below". When a structure is "on" an other structure, it may mean that a structure is integrally formed on the other structure, or that a structure is "directly" arranged on the other structure, or that a structure is "indirectly" arranged through another structure.

In the specification, terms "a", "an", "the" and "said" are used to indicate presence of one or more elements/components, etc. Terms "comprising", "including" and "having" are used to represent an open-ended inclusion, and mean that there may be additional elements/components/etc., in addition to the listed elements/components/etc. Terms "first", "second" and "third", etc., are used only as reference numerals, instead a limit on the number of objects thereof.

It should be understood that the present disclosure does not limit its application to the detailed structure and arrangement of the components as set forth in the specification. The present disclosure is capable of having other embodiments and of being implemented and carried out in various ways. The foregoing variations and modifications fall within the scope of the present disclosure. It should be understood that the present disclosure disclosed and defined in the specification extends to all alternative combinations of two or more individual features that are mentioned or apparent in the specification and/or the drawings. All of these different combinations constitute a plurality of alternative aspects of the present disclosure. The embodiments described in the specification are illustrative of the best mode to implement the present disclosure, and will enable those skilled in the art to utilize the present disclosure.

What is claimed is:

1. A flexible support plate, comprising:
an opening area and at least one solid area arranged on at least one side of the opening area; wherein the opening area comprises a middle area and a transition area, both the middle area and the transition area are provided with a plurality of through holes, the transition area is arranged between the middle area and the solid area, and a width of the transition area decreases as a distance to the middle area increases;
wherein the transition area comprises a plurality of first transition sub-areas and a plurality of second transition sub-areas, and wherein a density of through holes in the middle area is equal to or greater than a density of through holes in the plurality of first transition sub-areas, and a density of through holes in the second transition sub-areas is smaller than the density of through holes in the plurality of first transition sub-areas.

2. The flexible support plate according to claim 1, wherein each of the first transition sub-areas is arranged between the middle area and the solid area, and a width of each of the first transition sub-areas decreases as a distance to the middle area increases.

3. The flexible support plate according to claim 2, wherein a boundary connecting the first transition sub-areas and the solid area is provided in an arc or a polyline shape.

4. The flexible support plate according to claim 2, wherein the plurality of first transition sub-areas have same shapes and same areas, or the plurality of first transition sub-areas have same shapes and different areas, or the plurality of first transition sub-areas have different shapes and different areas.

5. The flexible support plate according to claim 2, wherein each of the second transition sub-areas is connected between the first transition sub-areas and the solid area, and a width of an end portion of each of the second transition sub-areas close to the solid area decreases as a distance to the middle area increases.

6. The flexible support plate according to claim 5, wherein a boundary connecting the second transition sub-areas and the solid area is provided in an arc or a polyline shape.

7. The flexible support plate according to claim 5, wherein the plurality of second transition sub-areas have same shapes and same areas, or the plurality of second transition sub-areas have same shapes and different areas, or the plurality of second transition sub-areas have different shapes and different areas.

8. The flexible support plate according to claim 5, wherein cross-sectional areas of through holes in the middle area are equal to or greater than cross-sectional areas of through holes in the plurality of first transition sub-areas, and cross-sectional areas of through holes in the second transition sub-areas are smaller than cross-sectional areas of through holes in the plurality of first transition sub-areas.

9. The flexible support plate according to claim 1, wherein a density of through holes in the transition area decreases as a distance to the middle area increases.

10. The flexible support plate according to claim 1, wherein a cross-sectional area of the through hole in the transition area decreases as a distance to the middle area increases.

11. A flexible display device, comprising a flexible support plate, wherein the flexible support plate comprises:
an opening area and at least one solid area arranged on at least one side of the opening area; wherein the opening area comprises a middle area and a transition area, both the middle area and the transition area are provided with a plurality of through holes, the transition area is arranged between the middle area and the solid area, and a width of the transition area decreases as a distance to the middle area increases;
wherein the transition area comprises a plurality of first transition sub-areas and a plurality of second transition sub-areas, and wherein a density of through holes in the middle area is equal to or greater than a density of through holes in the plurality of first transition sub-areas, and a density of through holes in the second transition sub-areas is smaller than the density of through holes in the plurality of first transition sub-areas.

12. The flexible display device according to claim 11, further comprising:
a flexible display panel arranged on a side of the flexible support plate, wherein the flexible display panel comprises a bending area, a planar area, and a connecting area connected between the bending area and the planar area, the bending area is arranged opposite to the middle area of the flexible support plate, and the connecting area is arranged opposite to the transition area of the flexible support plate.

13. The flexible display device according to claim 11, wherein an orthographic projection of the bending area on the flexible support plate coincides with the middle area.

14. The flexible display device according to claim 11, wherein each of the first transition sub-areas is arranged between the middle area and the solid area, and a width of each of the first transition sub-areas decreases as a distance to the middle area increases.

15. The flexible display device according to claim 14, wherein a boundary connecting the first transition sub-areas and the solid area is provided in an arc or a polyline shape.

16. The flexible display device according to claim 14, wherein the plurality of first transition sub-areas have same shapes and same areas, or the plurality of first transition sub-areas have same shapes and different areas, or the plurality of first transition sub-areas have different shapes and different areas.

17. The flexible display device according to claim 14, wherein each of the second transition sub-areas is connected between the first transition sub-areas and the solid area, and a width of an end portion of each of the second transition sub-areas close to the solid area decreases as a distance to the middle area increases.

18. The flexible display device according to claim 17, wherein the plurality of second transition sub-areas have same shapes and same areas, or the plurality of second transition sub-areas have same shapes and different areas, or the plurality of second transition sub-areas have different shapes and different areas.

19. The flexible display device according to claim 17, wherein cross-sectional areas of through holes in the middle area are equal to or greater than cross-sectional areas of through holes in the plurality of first transition sub-areas, and cross-sectional areas of through holes in the second transition sub-areas are smaller than cross-sectional areas of through holes in the plurality of first transition sub-areas.

20. The flexible display device according to claim 11, wherein a density of through holes in the transition area decreases as a distance to the middle area increases.

* * * * *